(12) United States Patent
Oda

(10) Patent No.: US 7,716,806 B2
(45) Date of Patent: May 18, 2010

(54) TANTALUM SPUTTERING TARGET AND METHOD FOR PREPARATION THEREOF

(75) Inventor: Kunihiro Oda, Ibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 911 days.

(21) Appl. No.: 11/533,092

(22) Filed: Sep. 19, 2006

(65) Prior Publication Data

US 2007/0062807 A1 Mar. 22, 2007

Related U.S. Application Data

(62) Division of application No. 10/514,955, filed as application No. PCT/JP03/09575 on Jul. 29, 2003, now Pat. No. 7,156,963.

(30) Foreign Application Priority Data

Sep. 20, 2002 (JP) ............................. 2002-274308

(51) Int. Cl.
*B21B 1/46* (2006.01)
*C23C 14/00* (2006.01)

(52) U.S. Cl. ................................ 29/527.5; 204/298.12

(58) Field of Classification Search ................ 29/527.5, 29/527.7, 428; 204/298.12, 298.13, 192.12; 148/668, 516

See application file for complete search history.

(56) References Cited

U.S. PATENT DOCUMENTS

| | | | |
|---|---|---|---|
| 4,994,118 A | 2/1991 | Pircher et al. | |
| 5,836,506 A * | 11/1998 | Hunt et al. | 228/172 |
| 6,071,389 A * | 6/2000 | Zhang | 204/298.12 |
| 6,193,821 B1 | 2/2001 | Zhang | |
| 6,197,134 B1 | 3/2001 | Kanzaki et al. | |
| 6,323,055 B1 | 11/2001 | Rosenberg et al. | |
| 6,331,233 B1 | 12/2001 | Turner | |
| 6,348,113 B1 | 2/2002 | Michaluk et al. | |
| 6,348,139 B1 | 2/2002 | Shah et al. | |
| 6,759,143 B2 | 7/2004 | Oda et al. | |
| 6,770,154 B2 | 8/2004 | Koenigsmann et al. | |
| 6,893,513 B2 | 5/2005 | Michaluk et al. | |
| 2002/0063056 A1 | 5/2002 | Shah et al. | |
| 2005/0268999 A1 | 12/2005 | Oda | |
| 2007/0023281 A1 | 2/2007 | Oda | |
| 2007/0062806 A1 | 3/2007 | Oda | |
| 2007/0102288 A1 | 5/2007 | Oda et al. | |

FOREIGN PATENT DOCUMENTS

| | | |
|---|---|---|
| EP | 0902102 A1 | 3/1999 |
| WO | 99/66100 A1 | 12/1999 |

OTHER PUBLICATIONS

English Abstract of JP 2001-271161 A, Oct. 2, 2001.
English Abstract of JP 2000-323433 A, Nov. 24, 2000.
English Abstract of JP 2000-239835 A, Sep. 5, 2000.
English Abstract of JP 2002-363736 A, Dec. 18, 2002.
English Abstract of JP 09-104972 A, Apr. 22, 1997.
English Abstract of JP 2002-363662 A, Dec. 18, 2002.
Michaluk et al., "Tantalum 101: Economics and Technology of Ta Materials", Semiconductor International, pp. 271-278, Jul. 2000.
Unpublished Co-pending U.S. Appl. No. 11/912,450.
Patent Abstracts of Japan, one page English Abstract of JP 06-264232, Sep. 1994.
Patent Abstracts of Japan, one page English Abstract of JP 01-215426, Aug. 1989.
Patent Abstracts of Japan, one page English Abstract of JP 61-124566, Jun. 1986.
Patent Abstracts of Japan, one page English Abstract of JP 2000-323434, Nov. 2000.

* cited by examiner

*Primary Examiner*—John C Hong
(74) *Attorney, Agent, or Firm*—Howson & Howson LLP

(57) ABSTRACT

Provided is a tantalum sputtering target having a crystal structure in which the (222) orientation is preferential from a position 10% of the target thickness toward the center face of the target, and a manufacturing method of a tantalum sputtering target, including the steps of forging and recrystallization annealing, and thereafter rolling, a tantalum ingot or billet having been subject to melting and casting, and forming a crystal structure in which the (222) orientation is preferential from a position of 10% of the target thickness toward the center face of the target. As a result, evenness (uniformity) of the film is enhanced, and quality of the sputter deposition is improved.

11 Claims, No Drawings

TANTALUM SPUTTERING TARGET AND METHOD FOR PREPARATION THEREOF

CROSS REFERENCE TO RELATED APPLICATION

This application is a divisional of U.S. application Ser. No. 10/514,955, now U.S. Pat. No. 7,156,963, which is the National Stage of International Application No. PCT/JP03/09575, filed Jul. 29, 2003, which claims the benefit under 35 USC 119 of Japanese Application No. 2002-274308, filed Sep. 20, 2002.

BACKGROUND OF THE INVENTION

The present invention pertains to a tantalum sputtering target capable of enhancing the evenness (uniformity) of a film and improving the quality of sputter deposition, and a method for manufacturing a tantalum sputtering target having the foregoing properties by performing forging, annealing, rolling processing, heat treatment and so on to a tantalum ingot or billet having been subject to melting and casting.

In recent years, the sputtering method for forming a film from materials such as metal or ceramics has been used in numerous fields such as electronics, corrosion resistant materials and ornaments, catalysts, as well as in the manufacture of cutting/grinding materials and abrasion resistant materials.

Although the sputtering method itself is a well-known method in the foregoing fields, recently, particularly in the electronics field, a tantalum sputtering target suitable for forming films of complex shapes and forming circuits is in demand.

Generally, this tantalum target is manufactured by forging and annealing (heat treatment) an ingot or billet formed by performing electron beam melting and casting to a tantalum material, and thereafter performing rolling and finishing processing (mechanical processing, polishing, etc.) thereto.

In this kind of manufacturing procedure, the forging performed to the ingot or billet will destroy the cast structure, disperse or eliminate the pores and segregations, and, by further annealing this, recrystallization will occur, and the precision and strength of the structure can be improved to a certain degree.

Generally, the ingot or billet subject to melting and casting has a crystal grain size of roughly 50 mm. By performing forging and recrystallization annealing to the ingot or billet, the casting structure will be destroyed, and, for the most part, even and fine (100 μm or less) crystal grains can be obtained, but there is a problem in that these coarse crystals will remain even in the final product.

Generally, upon performing sputtering, the finer and more uniform the crystals of the target, the more even the deposition, and a film having stable characteristics can be obtained.

Therefore, the existence of irregular crystal grains that are generated during forging, rolling or the annealing to be performed thereafter will change the sputtering rate, and there is a problem in that evenness (uniformity) of the film will be affected, and the quality of sputter deposition will deteriorate.

Further, if a forged product with strain remaining therein is used as is, the quality will deteriorate, and this must be avoided at all costs.

Meanwhile, when sputtering a tantalum target with a magnetron sputtering device, only a certain area along the magnetic line will in particular become eroded (generally, the erosion will progress in a donut shape), and this will gradually become steeper together with the progress of erosion up to the end of sputtering.

At portions where erosion progresses in particular, the surface area of the target will increase, and the difference in the surface area in comparison to the other areas will become significant. This difference in surface area will become the difference in the sputter rate, and the film tends to be formed thick at the substrate (wafer) portion positioned opposite to the portion with an increased surface area where sputtering is focused, and, contrarily, the film tends to be formed thinly at portions where sputtering is not as focused.

This not only generates a problem in that an uneven film is formed in a single wafer, this will also generate a problem in that the film thickness will vary from the start to end in the plurality of wafers to be sputtered. In other words, this will lead to the deterioration in the uniformity of sputter deposition.

As a method of improving the uniformity of such sputter deposition, it has been generally proposed that the structure should be made uniform as possible, and in particular to align the crystal orientation across the entire thickness direction of the target. Nevertheless, by merely aligning the crystal orientation, there is a problem in that the deterioration of the sputtering film uniformity resulting from the variation in the foregoing surface area could not be resolved.

As a conventional manufacturing method of a tantalum sputtering target or high purity tantalum, a manufacturing method of high purity tantalum has been disclosed (e.g., Patent Document 1 below) comprising the steps of melting and highly purifying a tantalum sputtering target containing 500 ppm or less of metallic impurities and $K_2TaF_7$, reacting the highly purified $K_2TaF_7$ with a reducer and obtaining tantalum powder, and reacting this tantalum powder with iodine in a container.

Further, a 99.95 wt % tantalum sputtering target having an equiaxed structure of (100) and a maximum grain size of 50 microns or less manufactured by rolling and forging has also been disclosed (e.g., Patent Document 2 below).

Moreover, a high purity tantalum target having a fine structure and capable of uniform sputtering, in particular, a high purity tantalum target of a fine structure in which the average crystal grain size is 100 μm or less and (111)<uvw> is preferentially orienting evenly toward the thickness direction of the target has also been disclosed (e.g., Patent Document 3 below).

Patent Document 1: PC (WO) 2002-516918
Patent Document 2: PC (WO) 2002-518593
Patent Document 3: U.S. Pat. No. 6,331,233

SUMMARY OF THE INVENTION

In order to overcome the foregoing problems, an object of the present invention is to provide a tantalum sputtering target capable of enhancing evenness (uniformity) of the film and improving the quality of sputter deposition upon sputtering as a result of improving the structure of the crystal orientation of the target, and improving and elaborating the forging, rolling and heat treatment processes for manufacturing such improved target, as well as a method of stably manufacturing such a target.

The present invention provides:

1. A tantalum sputtering target comprising a crystal structure in which the (222) orientation is preferential from a position of 30% of the target thickness toward the center face of the target;
2. A tantalum sputtering target comprising a crystal structure in which the (222) orientation is preferential from a position of 20% of the target thickness toward the center face of the target;

3. A tantalum sputtering target comprising a crystal structure in which the (222) orientation is preferential from a position of 10% of the target thickness toward the center face of the target;
4. A tantalum sputtering target according to anyone of paragraphs 1 to 3 above, comprising a crystal structure in which the (222) orientation is preferential at a position excluding the peripheral edge of the target;
5. A tantalum sputtering target comprising a crystal structure in which the (222) orientation is preferential in a disc shape at the center portion of the target;
6. A tantalum sputtering target according to any one of paragraphs 1 to 4 above, comprising a crystal structure in which the (222) orientation is preferential in a disc shape at the center portion of the target;
7. A tantalum sputtering target according to any one of paragraphs 1 to 6 above, comprising a crystal structure in which the (222) orientation is preferential at a position immediately beneath the initial erosion portion of the target or a position of the erosion portion when sputtering is performed or a position in the vicinity thereof;
8. A manufacturing method of a tantalum sputtering target, comprising the steps of forging and recrystallization annealing, and thereafter rolling, a tantalum ingot or billet having been subject to melting and casting, and forming a crystal structure in which the (222) orientation is preferential from a position of 10% of the target thickness toward the center face of the target;
9. A manufacturing method of a tantalum sputtering target according to paragraph 8 above, wherein formed is a crystal structure in which the (222) orientation is preferential at a position excluding the peripheral edge of the target;
10. A manufacturing method of a tantalum sputtering target according to paragraph 8 or paragraph 9 above, wherein formed is a crystal structure in which the (222) orientation is preferential in a disc shape at the center portion of the target;
11. A tantalum sputtering target according to any one of paragraphs 8 to 10 above, wherein formed is a crystal structure in which the (222) orientation is preferential at a position immediately beneath the initial erosion portion of the target or a position of the erosion portion when sputtering is performed or a position in the vicinity thereof;
12. A manufacturing method of a tantalum sputtering target according to any one of paragraphs 8 to 11 above, wherein forging and recrystallization annealing are repeated two or more times;
13. A manufacturing method of a tantalum sputtering target according to any one of paragraphs 8 to 12 above, wherein kneading is further performed;
14. A manufacturing method of a tantalum sputtering target according to any one of paragraphs 8 to 13 above, wherein, after forging, cross rolling and heat treatment are performed to process a tabular target;
15. A manufacturing method of a tantalum sputtering target according to any one of paragraphs 8 to 14 above, wherein, after forging the ingot or billet, recrystallization annealing is performed at a recrystallization temperature of up to 1673 K;
16. A manufacturing method of a tantalum sputtering target according to any one of paragraphs 8 to 15 above, wherein, after rolling, crystal homogenization annealing or straightening annealing is performed;
17. A manufacturing method of a tantalum sputtering target according to any one of paragraphs 8 to 16 above, wherein the average crystal grain size of the target is made to be a fine crystal grain size of 80 µm or less; and
18. A manufacturing method of a tantalum sputtering target according to any one of paragraphs 8 to 16 above, wherein the average crystal grain size of the target is made to be a fine crystal grain size of 30 to 60 µm or less.

DETAILED DESCRIPTION OF THE INVENTION

The tantalum sputtering target of the present invention comprises a crystal structure in which the (222) orientation is preferential from a position of 30% of the target thickness, or a position of 20% of the target thickness, or a position of 10% of the target thickness toward the center face of the target. This position may be suitably adjusted in accordance with conditions such as the measurement, shape or target deposition of the tantalum target.

This yields a structure where the structure of the (222) orientation is spreading in a disc shape (or convex lens shape) at the center of the target, and, generally speaking, a crystal structure having a preferential (222) orientation does not exist at the peripheral edge of the target.

Although a crystal structure of the (222) orientation may exist up to the peripheral edge portion, it will be difficult to manufacture a target, with a favorable yield ratio, upon performing the forging and rolling processes described later. Further, since the peripheral edge of the target will not erode much and because erosion will not continue up to the late stage of sputtering, the target will not be affected in particular.

From the structure of the foregoing target, the crystal structure of the (222) orientation will be positioned immediately beneath the initial erosion portion of the target or at the erosion portion when sputtering is performed or in the vicinity thereof.

As described above, after the start of sputtering, although the erosion will progress roughly along the magnetic line; that is, although the erosion will progress in a donut shape on the planar surface of the target, and gradually become steeper, the surface area of the target will increase at the portion where erosion is progressing in particular, and the difference of the surface area in comparison to the other areas will become significant.

This difference in surface area will become the difference in the amount of tantalum to be sputtered; that is, it will become the difference in the sputter rate, and there is a problem in that the film tends to be formed thick at the substrate (wafer) portion positioned opposite to the portion with an increased surface area where sputtering is focused, and, contrarily, the film tends to be formed thinly at portions where sputtering is not as focused. This will cause deterioration in the uniformity of sputter deposition.

Nevertheless, with the tantalum target of the present invention having a structure where the structure of the (222) orientation is spreading in a disc shape (or convex lens shape) at the center of the target, it has become clear that the deterioration in uniformity of the sputtering film can be considerably reduced. Although this phenomenon has not been fully clarified, the following can be considered to be the reason therefor.

In other words, when employing the tantalum target of the present invention, since it is not the crystal structure of the (222) orientation at the initial stage and (110), (200) and (211) are the main orientations, erosion will occur at a normal sputtering speed (rate). Since a tantalum target having this kind of orientation has a relatively fast sputtering speed, the productivity will improve, and it could be said that this is preferable.

Then, erosion will progress in a donut shape on the target face roughly along the magnetic line. This is no different than conventional erosion, and, upon being subject to further erosion, the erosion portion will gradually become steeper.

Further, the sputter rate will change on the planar surface of the target as a result of the above, and uniformity of the sputtering film will deteriorate.

And, since the rolling of the erosion face will enlarge as described above, the target surface area of such portion will increase even further, and deterioration of uniformity tends to increase at an accelerated pace.

Nevertheless, when employing the tantalum target of the present invention, the structure of the (222) orientation will appear on the erosion face midway during the progress of erosion. The structure of this (222) orientation is characterized in that the sputter rate is slow in comparison to other orientations.

The meaning of this is extremely significant, and the structure of the (222) orientation appearing midway suppresses the rapid progress of steep and uneven (partial) erosion, and, the structure of the (222) orientation having a slow sputter rate offsets the sputter amount of tantalum which increased pursuant to the increase in the surface area, and functions to make the sputter amount; that is, the sputter rate uniform up to the late stage of sputtering. Therefore, the total thickness of the film formed on the substrate and the film thickness distribution within the wafer can be made uniform, and this will function to prevent the deterioration of uniformity.

Since the erosion on the target surface is progressing to a certain degree, the appearance of the target does not seem to be much different from a conventional target. Thus, it has been confirmed that a significant difference is evident in the uniformity of the deposition.

From which point of the target thickness the crystal structure in which the (222) orientation is preferential should be disposed may be changed in accordance with the thickness of the target, the size of the surface area or required deposition conditions, and the (222) orientation may be arbitrarily selected from the position of 30% or 20% or 10% of the thickness toward the center face of the target.

It is desirable to make the crystal structure of the (222) orientation in a state where erosion has progressed a certain degree. With a target having a uniform structure from the surface toward the center portion, the surface erosion will become uneven as described above and, therefore, it could be said that it is not possible to secure the uniformity of deposition.

The tantalum sputtering target of the present invention is manufactured with the following processes. Specifically, foremost, a tantalum raw material (high purity tantalum of 4N5N or higher is ordinarily used) is melted with electron beam melting or the like, and this is cast to prepare an ingot or billet.

Next, this ingot or billet is subject to a series of processes such as hot forging, cold forging, rolling, annealing (heat treatment), finishing processing and so on such that a crystal structure in which the (222) orientation is preferential from a position of 30% of the target thickness, or a position of 20% of the target thickness, or a position of 10% of the target thickness toward the center face of the target is formed.

Further, as a result, a crystal structure in which the (222) orientation is preferential in a disc shape may be formed at the center portion of the target; that is, a position immediately beneath the initial erosion portion of the target or a position of the erosion portion when sputtering is performed or a position in the vicinity thereof.

When forming a crystal structure in which the (222) orientation is preferential at the center portion of the target by performing forging, recrystallization annealing and rolling processing, it is difficult to form a crystal structure in which the (222) orientation is preferential up to the peripheral edge of the target even upon adjusting the conditions of forging, recrystallization annealing and rolling processing.

Although it is possible to cut the portions of the target without any (222) orientation, there is a problem in that the yield rate will deteriorate. Nevertheless, since this peripheral edge hardly erodes, and is not a portion that will in particular affect the deposition, the (222) orientation may be formed in a disc shape excluding the peripheral edge.

Moreover, with respect to the forging conditions, by repeating forging and recrystallization annealing two or more times, a tantalum sputtering target having the foregoing structure may be manufactured efficiently. Further, sufficient forging is required for forming a crystal structure in which the (222) orientation is preferential, and kneading which repeats upset forging and extend forging is in particular effective.

In addition, it is effective to perform cross rolling (multi-direction rolling) and heat treatment after forging in order to prepare a tabular target.

As the annealing condition, after forging the ingot or billet, it is desirable to perform recrystallization annealing at a recrystallization temperature of up to 1673 K. Although recrystallization annealing may be performed once at a recrystallization temperature of 1673 K, a desired casting structure may be effectively obtained by repeating such recrystallization annealing process twice.

The temperature loss is significant and wasteful when the annealing temperature exceeds 1673 K, and it is desirable that that the temperature be 1673 K or lower.

As a result, a tantalum sputtering target comprising a crystal structure in which the (222) orientation is preferential from a position of 30% of the target thickness, or a position of 20% of the target thickness, or a position of 10% of the target thickness toward the center face of the target may be obtained, and a tantalum sputtering target having an average crystal grain size of 80 μm or less, and even a fine crystal grain size of 30 to 60 μm may also be manufactured.

When performing sputtering with the target of the present invention, evenness (uniformity) of the film can be further enhanced, and quality of the sputter deposition may be further improved.

EXAMPLES AND COMPARATIVE EXAMPLES

The present invention is now explained in detail with reference to the Examples. These Examples are merely illustrative, and the present invention shall in no way be limited thereby. In other words, the present invention shall only be limited by the scope of claim for a patent, and shall include the various modifications other than the Examples of this invention.

Example 1

A tantalum raw material having a purity of 99.997% was subject to electron beam melting, and this was cast to prepare an ingot having a length of 1000 nm and diameter of 200 mm φ. The crystal grain size in this case was approximately 50 mm. Next, this ingot was subject to cold tightening forging and made to be 110 mm φ, thereafter cut into a billet having a thickness of 110 mm and a diameter of 110 mm φ. This billet was subject to cold kneading, and thereafter subject to recrystallization annealing at a temperature of 1173 K, cold kneading was performed thereto once again, and recrystallization annealing was also performed at a temperature of 1173 K once again.

Next, the forged ingot was subject to cold rolling (multi direction), and straightening and recrystallization processing (heat treatment) was performed at 1173 K to obtain a target raw material having a thickness of 10 mm and 350 mm φ, and mechanical finishing processing was performed thereto to obtain a target material having a thickness of 6.35 mm and 320 mm φ.

With the foregoing processes, obtained was a tantalum target superior in uniformity comprising a crystal structure in which the (222) orientation was preferential from a position of 30% of the target thickness toward the center face of the target, and having a fine crystal grain size in which the average crystal grain size was 45 μm. When performing sputtering with this tantalum target, evenness (uniformity) of the film was favorable, and quality of the sputter deposition improved. The results are shown in Table 1.

Incidentally, since the sheet resistance depends on the film thickness, distribution of the sheet resistance within the wafer (8 inch) was measured, and the status of film thickness distribution was examined thereby. Specifically, the sheet resistance at 49 points on the wafer was measured, and the standard deviation (σ) was calculated.

As evident from Table 1, in Example 1, variation in the resistance distribution within the sheet from the initial stage of sputtering to the late stage of sputtering was small; that is, variation in the film thickness distribution was small.

TABLE 1

Transition (1 σ) of Sheet Resistance Distribution in Wafer (8 Inch)

|  | Example 1 | Example 2 | Example 3 | Comparative Example 1 | Comparative Example 2 |
|---|---|---|---|---|---|
| (222) Orientation Position from Surface | 30% | 10% | 20% | — | — |
| Initial Stage of Sputtering | 4.5% | 4.8% | 4.4% | 4.3% | 4.8% |
| Mid Stage of Sputtering | 5.5% | 4.4% | 5.1% | 6.5% | 7.2% |
| Late Stage of Sputtering | 5.1% | 4.7% | 5.0% | 11.2% | 11.5% |

Example 2

A tantalum raw material having a purity of 99.997% was subject to electron beam melting, and this was cast to prepare an ingot having a length of 1000 nm and diameter of 200 mm φ. The crystal grain size in this case was approximately 55 mm. Next, this ingot was subject to cold tightening forging and made to be 110 mm φ, thereafter cut into a billet having a thickness of 110 mm and a diameter of 110 mm φ. This billet was subject to cold kneading, and thereafter subject to recrystallization annealing at a temperature of 1523 K, cold kneading was performed thereto once again, and recrystallization annealing was also performed at a temperature of 1523 K once again.

Next, the forged ingot was subject to cold rolling (multi direction), and straightening and recrystallization processing (heat treatment) was performed at 1523 K to obtain a target raw material having a thickness of 10 mm and 350 mm φ, and mechanical finishing processing was performed thereto to obtain a target material having a thickness of 6.35 mm and 320 mm φ.

With the foregoing processes, obtained was a tantalum target superior in uniformity comprising a crystal structure in which the (222) orientation was preferential from a position of 10% of the target thickness toward the center face of the target, and having a fine crystal grain size in which the average crystal grain size was 80 μm. When performing sputtering with this tantalum target, evenness (uniformity) of the film was favorable, and quality of the sputter deposition improved. The results are similarly shown in Table 1.

Incidentally, since the sheet resistance depends on the film thickness, distribution of the sheet resistance within the wafer (8 inch) was measured, and the status of film thickness distribution was examined thereby. Specifically, the sheet resistance at 49 points on the wafer was measured, and the standard deviation (σ) was calculated.

The results shown in Example 2 of Table 1 were obtained by measuring the sheet resistance at 49 points on the wafer as with Example 1, and calculating the standard deviation (σ) thereof. In Example 2, variation in the resistance distribution within the sheet from the initial stage of sputtering to the late stage of sputtering was small; that is, variation in the film thickness distribution was small.

Example 3

A tantalum raw material having a purity of 99.997% was subject to electron beam melting, and this was cast to prepare an ingot having a length of 1000 nm and diameter of 200 mm φ. The crystal grain size in this case was approximately 55 mm. Next, this ingot was subject to cold tightening forging and made to be 110 mm φ, thereafter cut into a billet having a thickness of 110 mm and a diameter of 110 mm φ. This billet was subject to cold kneading, and thereafter subject to recrystallization annealing at a temperature of 1373 K, cold kneading was performed thereto once again, and recrystallization annealing was also performed at a temperature of 1373 K once again.

Next, the forged ingot was subject to cold rolling (multi direction), and straightening and recrystallization processing (heat treatment) was performed at 1373 K to obtain a target raw material having a thickness of 10 mm and 350 mm φ, and mechanical finishing processing was performed thereto to obtain a target material having a thickness of 6.35 mm and 320 mm φ.

With the foregoing processes, obtained was a tantalum target superior in uniformity comprising a crystal structure in which the (222) orientation was preferential from a position of 20% of the target thickness toward the center face of the target, and having a fine crystal grain size in which the average crystal grain size was 60 μm. When performing sputtering with this tantalum target, evenness (uniformity) of the film was favorable, and quality of the sputter deposition improved. The results are similarly shown in Table 1.

The results shown in Example 3 of Table 1 were obtained by measuring the sheet resistance at 49 points on the wafer (8 inch) as with Example 1, and calculating the standard deviation (σ) thereof. In Example 3, variation in the resistance distribution within the sheet from the initial stage of sputtering to the late stage of sputtering was small; that is, variation in the film thickness distribution was small.

Comparative Example 1

A tantalum raw material having a purity of 99.997% was subject to electron beam melting, and this was cast to prepare an ingot having a length of 1000 mm and diameter of 200 mm φ. The crystal grain size in this case was approximately 50 mm. Next, this ingot was subject to cold tightening forging and made to be rectangle having a width of 350 mm, height of 85 mm and length of 1000 mm, thereafter cut into a billet having a length of 80 mm, width of 350 mm and height of 85 mm. This billet was subject to recrystallization annealing at a temperature of 1173 K, thereafter extended to a length of 700 mm by performing cold unidirectional rolling, and straightening and recrystallization annealing was performed at a temperature of 1173 K to obtain two sheets of a target raw material having a thickness of 10 mm and 350 mm φ, and mechanical finishing processing was performed thereto to obtain a target material having a thickness of 6.35 mm and 320 mm φ.

With the tantalum target obtained with the foregoing processes, the crystal grains were 60 to 120 μm and varied in a layer shape, and became a tantalum target in which the orientation was mostly aligned from the target surface toward the center portion.

When performing sputtering with this tantalum target, evenness (uniformity) of the film was inferior, and caused the quality of sputter deposition to deteriorate. The results are similarly shown in Table 1.

The results shown in Comparative Example 1 of Table 1 were obtained by measuring the sheet resistance at 49 points on the wafer (8 inch) as with Example 1, and calculating the standard deviation (σ) thereof. In Comparative Example 1, variation in the resistance distribution within the sheet from the initial stage of sputtering to the late stage of sputtering was large; that is, variation in the film thickness distribution was significant.

Comparative Example 2

A tantalum raw material having a purity of 99.997% was subject to electron beam melting, and this was cast to prepare an ingot having a length of 1000 mm and diameter of 200 mm φ. The crystal grain size in this case was approximately 50 mm. Next, this ingot was subject to cold tightening forging and made to be rectangle having a width of 350 mm, height of 85 mm and length of 1000 mm, thereafter cut into a billet having a length of 80 mm, width of 350 mm and height of 85 mm.

This billet was subject to recrystallization annealing at a temperature of 1373 K, thereafter extended to a length of 700 mm by performing cold unidirectional rolling, and straightening and recrystallization annealing was performed at a temperature of 1373 K to obtain two sheets of a target raw material having a thickness of 10 mm and 350 mm φ, and mechanical finishing processing was performed thereto to obtain a target material having a thickness of 6.35 mm and 320 mm φ.

With the tantalum target obtained with the foregoing processes, the crystal grains were 80 to 150 μm and varied in a layer shape, and became a tantalum target in which the orientation was mostly aligned from the target surface toward the center portion.

When performing sputtering with this tantalum target, evenness (uniformity) of the film was inferior, and caused the quality of sputter deposition to deteriorate. The results are similarly shown in Table 1.

The results shown in Comparative Example 2 of Table 1 were obtained by measuring the sheet resistance at 49 points on the wafer (8 inch) as with Example 1, and calculating the standard deviation (σ) thereof. In Comparative Example 2, variation in the resistance distribution within the sheet from the initial stage of sputtering to the late stage of sputtering was large; that is, variation in the film thickness distribution was significant.

The present invention yields a significant effect of enhancing evenness (uniformity) of the film and improving quality of the sputtering deposition by providing a crystal structure in which the (222) orientation is preferential from a position of 30% of the target thickness, or a position of 20% of the target thickness, or a position of 10% of the target thickness toward the center face of the target and by forming a crystal structure in a disc shape (convex lens shape) at the center of the target.

The invention claimed is:

1. A method of manufacturing a tantalum sputtering target, comprising the steps of:
   melting and casting a tantalum raw material to form a tantalum ingot or billet, and
   forging and recrystallization annealing, and thereafter rolling, said tantalum ingot or billet to form a tantalum sputtering target having a target thickness and a crystal structure in which the (222) orientation is preferential in a disc shape or a convex lens shape at a position 10% of the target thickness from the center face of the target.

2. A method according to claim 1, wherein formed is a crystal structure in which the (222) orientation is preferential at a position excluding a peripheral edge of the target.

3. A method according to claim 1, wherein the crystal structure in which the (222) orientation is preferential in the disc shape or a convex lens shape is formed at a center portion of the target.

4. A method according to claim 1, wherein formed is a crystal structure in which the (222) orientation is preferential at a position selected from a position immediately beneath an initial erosion portion of the target, a position of an erosion portion of the target when sputtering is performed, and a position in the vicinity thereof.

5. A method according to claim 1, wherein said forging and recrystallization annealing step is repeated two or more times.

6. A method according to claim 1, further comprising the step of kneading said tantalum ingot or billet.

7. A method according to claim 1, wherein, after said forging step, said recrystallization annealing step is performed at a recrystallization temperature of up to 1673 K.

8. A method according to claim 1, further comprising the steps of cross rolling said tantalum ingot or billet and applying a heat treatment to said tantalum ingot or billet after said forging step to prepare a tabular target.

9. A method according to claim 8, wherein, after said rolling step, crystal homogenization annealing or straightening annealing is performed.

10. A method according to claim 1, wherein an average crystal grain size of the target is made to be a fine crystal grain size of 80 μm or less.

11. A method according to claim 1, wherein an average crystal grain size of the target is made to be a fine crystal grain size of 30 μm to 60 μm.

* * * * *